US012700835B2

(12) United States Patent
Wang

(10) Patent No.: US 12,700,835 B2
(45) Date of Patent: Aug. 4, 2026

(54) HYBRID CLASS-D AMPLIFIER

(71) Applicant: Realtek Semiconductor Corp.,
HsinChu (TW)

(72) Inventor: Chih-Chiang Wang, HsinChu (TW)

(73) Assignee: Realtek Semiconductor Corp.,
HsinChu (TW)

( * ) Notice: Subject to any disclaimer, the term of this
patent is extended or adjusted under 35
U.S.C. 154(b) by 502 days.

(21) Appl. No.: 18/200,593

(22) Filed: May 23, 2023

(65) Prior Publication Data

US 2023/0387870 A1 Nov. 30, 2023

(30) Foreign Application Priority Data

May 27, 2022 (TW) .................................. 111119791

(51) Int. Cl.
H03F 3/217 (2006.01)

(52) U.S. Cl.
CPC ..... H03F 3/2175 (2013.01); H03F 2200/171
(2013.01)

(58) Field of Classification Search
CPC ............. H03F 3/2175; H03F 2200/171; H03F
3/45475; H03F 2200/03; H03F 2200/351;
H03F 2203/45138; H03F 3/187; H03M
1/742; H03M 1/765

USPC ......................................... 330/10, 251, 207 A
See application file for complete search history.

(56) References Cited

U.S. PATENT DOCUMENTS

| | | | |
|---|---|---|---|
| 8,854,132 B2 * | 10/2014 | Lesso .................... | H03F 3/2173 |
| | | | 330/251 |
| 11,271,583 B2 | 3/2022 | Melanson | |
| 2019/0007008 A1 | 1/2019 | Berkhout | |
| 2021/0351751 A1 * | 11/2021 | Zanbaghi ................. | H03K 7/08 |

* cited by examiner

*Primary Examiner* — Andrea Lindgren Baltzell
*Assistant Examiner* — Khiem D Nguyen
(74) *Attorney, Agent, or Firm* — Winston Hsu

(57) ABSTRACT

A hybrid class-D amplifier is provided. The hybrid class-D
amplifier includes a digital-to-analog conversion (DAC)
input stage circuit, a loop filter circuit electrically coupled to
the DAC input stage circuit, a quantizer circuit electrically
coupled to the loop filter circuit, an output stage circuit
electrically coupled to the quantizer circuit, and a feedback
circuit electrically coupled between the output stage circuit
and the loop filter circuit. The DAC input stage circuit
converts a digital signal into an analog signal. The loop filter
circuit generates a filtered signal according to the analog
signal and a feedback signal. The quantizer circuit performs
a quantization operation on the filtered signal to generate a
quantized signal. The output stage circuit performs power
amplification on the quantized signal to generate an output
signal. The feedback circuit generates the feedback signal
according to the output signal.

7 Claims, 5 Drawing Sheets

HYBRID CLASS-D AMPLIFIER

BACKGROUND OF THE INVENTION

1. Field of the Invention

The present invention is related to power amplification, and more particularly, to a hybrid class-D amplifier.

2. Description of the Prior Art

In the field of audio playback, as a speaker is typically an extremely heavy output load, it is necessary to utilize a power amplifier for driving audio data to the speaker. Current systems typically store audio data as digital signals, meaning the audio data may need to undergo a series of processing operations such as signal conversion, signal amplification and power amplification for playback. Moreover, an output driving circuit is typically implemented with multiple operational amplifiers, which may be the most power consuming blocks in the whole output driving circuit. Thus, there is a need for a novel architecture to reduce the number of operational amplifiers within an output driving circuit, in order to reduce power consumption, and thereby improve an overall performance of an audio playback device.

SUMMARY OF THE INVENTION

An objective of the present invention is to provide a hybrid class-D amplifier, which can reduce the number of operational amplifiers as much as possible, in order to reduce overall power consumption without introducing any side effect or in a way that is less likely to introduce side effects.

At least one embodiment of the present invention provides a hybrid class-D amplifier. The hybrid class-D amplifier may comprise a digital-to-analog conversion (DAC) input stage circuit, a loop filter circuit, a quantizer circuit, an output stage circuit, and a feedback circuit, wherein the loop filter circuit is electrically coupled to the DAC input stage circuit, the quantizer circuit is electrically coupled to the loop filter circuit, the output stage circuit is electrically coupled to the quantizer circuit, and the feedback circuit is electrically coupled between the output stage circuit and the loop filter circuit. In particular, the DAC input stage circuit may be configured to convert a digital signal into an analog signal. The loop filter circuit may be configured to generate a filtered signal according to the analog signal and a feedback signal. The quantizer circuit may be configured to perform a quantization operation on the filtered signal to generate a quantized signal. The output stage circuit may be configured to perform power amplification on the quantized signal to generate an output signal. The feedback circuit may be configured to generate the feedback signal according to the output signal.

The hybrid class-D amplifier of the present invention takes a digital-to-analog converter as an input stage circuit of a class-D amplifier, reducing the number of operational amplifiers. In comparison with the related art, the embodiment of the present invention will not greatly increase additional costs. Thus, the present invention can reduce overall power consumption and accordingly improve overall performance without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
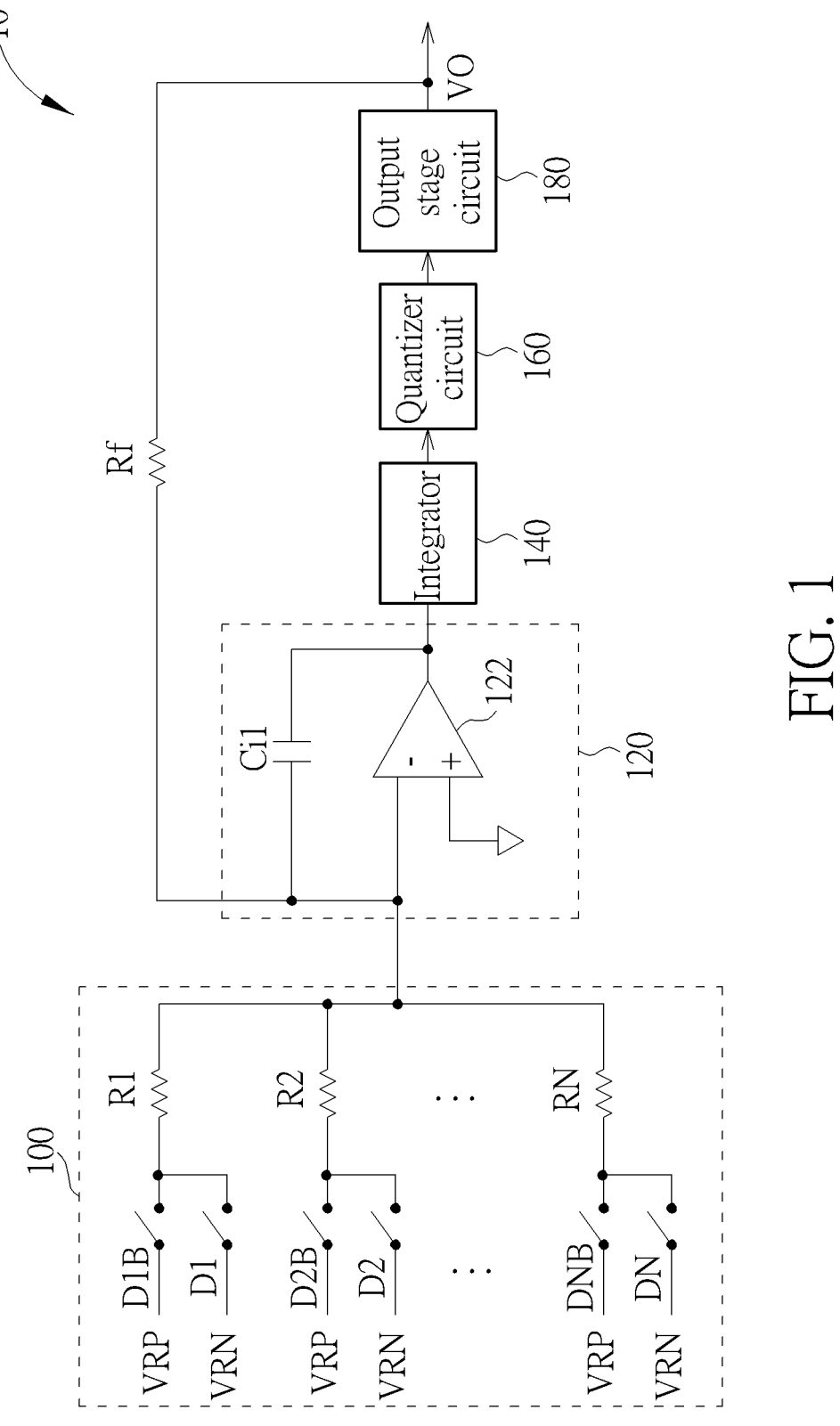
FIG. 1 is a diagram illustrating a hybrid class-D amplifier according to an embodiment of the present invention.

FIG. 1 is a diagram illustrating a hybrid class-D amplifier 10 according to an embodiment of the present invention. As shown in FIG. 1, the hybrid class-D amplifier 10 may comprise a digital-to-analog conversion (DAC) input stage circuit 100, a loop filter circuit (which may comprise one or more integrators such as integrators 120 and 140) electrically coupled to the DAC input stage circuit 100, a quantizer circuit 160 electrically coupled to the loop filter circuit (e.g. the integrator 140), an output stage circuit 180 electrically coupled to the quantizer circuit 160, and a feedback circuit electrically coupled between the output stage circuit 180 and the loop filter circuit (e.g. a resistor Rf electrically coupled between the output stage circuit 180 and the integrator 120). In this embodiment, the DAC input stage circuit 100 may be configured to convert a digital input signal into an analog signal. In addition, the loop filter circuit may be configured to generate a filtered signal according to the analog signal from the DAC input stage circuit 100 and a feedback signal from the resistor Rf. In detail, the integrator 120 may be configured to receive the analog signal and the feedback signal, and accordingly generate a preliminary filtered signal. The integrator 140 may generate the filtered signal according to the preliminary filtered signal. In some embodiments, the resistor Rf and the DAC input stage circuit 100 may be regarded as a portion of the integrator 120, but the present invention is not limited thereto. In addition, the quantizer circuit 160 may be configured to perform a quantization operation on the filtered signal to generate a quantized signal. The output stage circuit 180 may be configured to perform power amplification on the quantized signal to generate an output signal VO. The feedback circuit such as the resistor Rf may be configured to generate the feedback signal according to the output signal VO.

In this embodiment, the integrator 120 may comprise an operational amplifier 122 and a capacitor Ci1. Furthermore, the integrator 140 may be implemented in a same way as or a different way from the integrator 120. It should be noted that the number of integrators within the loop filter circuit is not limited to that illustrated in the architecture shown in FIG. 1.

In this embodiment, the DAC input stage circuit 100 may comprise N resistors such as R1, R2, . . . , and RN, and may further comprise switch circuits respectively corresponding to the resistors R1, R2, . . . , and RN, where N is a positive integer. In detail, one end of the resistor R1 may be electrically coupled to an input terminal of the loop filter circuit (e.g. an input terminal labeled "−" on the operational amplifier 122 within the integrator 120 shown in FIG. 1), and the other end of the resistor R1 may be electrically coupled to the corresponding switch circuit such as switches controlled by signals D1 and D1B, where D1 may represent a first bit of the digital input signal, and the signal D1B may represent an inverted bit of the first bit of the digital input signal. One end of the resistor R2 may be electrically coupled to the input terminal of the loop filter circuit (e.g. the input terminal labeled "−" on the operational amplifier 122 within the integrator 120 shown in FIG. 1), and the other end of the resistor R2 may be electrically coupled to the corresponding switch circuit such as switches controlled by signals D2 and D2B, where D2 may represent a second bit of the digital input signal, and the signal D2B may represent an inverted bit of the second bit of the digital input signal. By analogy, one end of the resistor RN may be electrically coupled to the input terminal of the loop filter circuit (e.g. the input terminal labeled "−" on the operational amplifier 122 within the integrator 120 shown in FIG. 1), and the other end of the resistor RN may be electrically coupled to the corresponding switch circuit such as switches controlled by signals DN and DNB, where DN may represent an $N^{th}$ bit of the digital input signal, and the signal D2B may represent an inverted bit of the $N^{th}$ bit of the digital input signal. In this embodiment, the switch circuit corresponding to the resistor R1 may control the resistor R1 to be electrically coupled to one of a first reference voltage (e.g. a positive reference voltage VRP) and a second reference voltage (e.g. a negative reference voltage VRN) according to the first bit (e.g. the signal D1 and the signal D1B) of the digital input signal. For example, when the first bit of the digital input signal is "1" (i.e. the signal D1 is "1" and the signal D1B is "0"), the resistor R1 may be electrically coupled to the negative reference voltage VRN; and when the first bit of the digital input signal is "0" (i.e. the signal D1 is "0" and the signal D1B is "1"), the resistor R1 may be electrically coupled to the positive reference voltage VRP. The control of the resistors R2, . . . and RN are similar to the resistor R1, and related details are omitted here for brevity.

In some embodiment, the hybrid class-D amplifier 10 may further comprise some functional circuits such as a programmable-gain amplifier (PGA), where the PGA may be configured to provide gain and a filtering effect on the signal path. The PGA typically comprises at least one operational amplifier. In order to reduce the number of operational amplifiers as much as possible, the gain provided by the PGA may be implemented by digital signal processing in a digital domain, and the filtering effect provided by the PGA may be implemented by a special design of the DAC input stage circuit 100. Thus, the PGA may be omitted in this embodiment in order to reduce the number of operational amplifiers.

Figure 2:
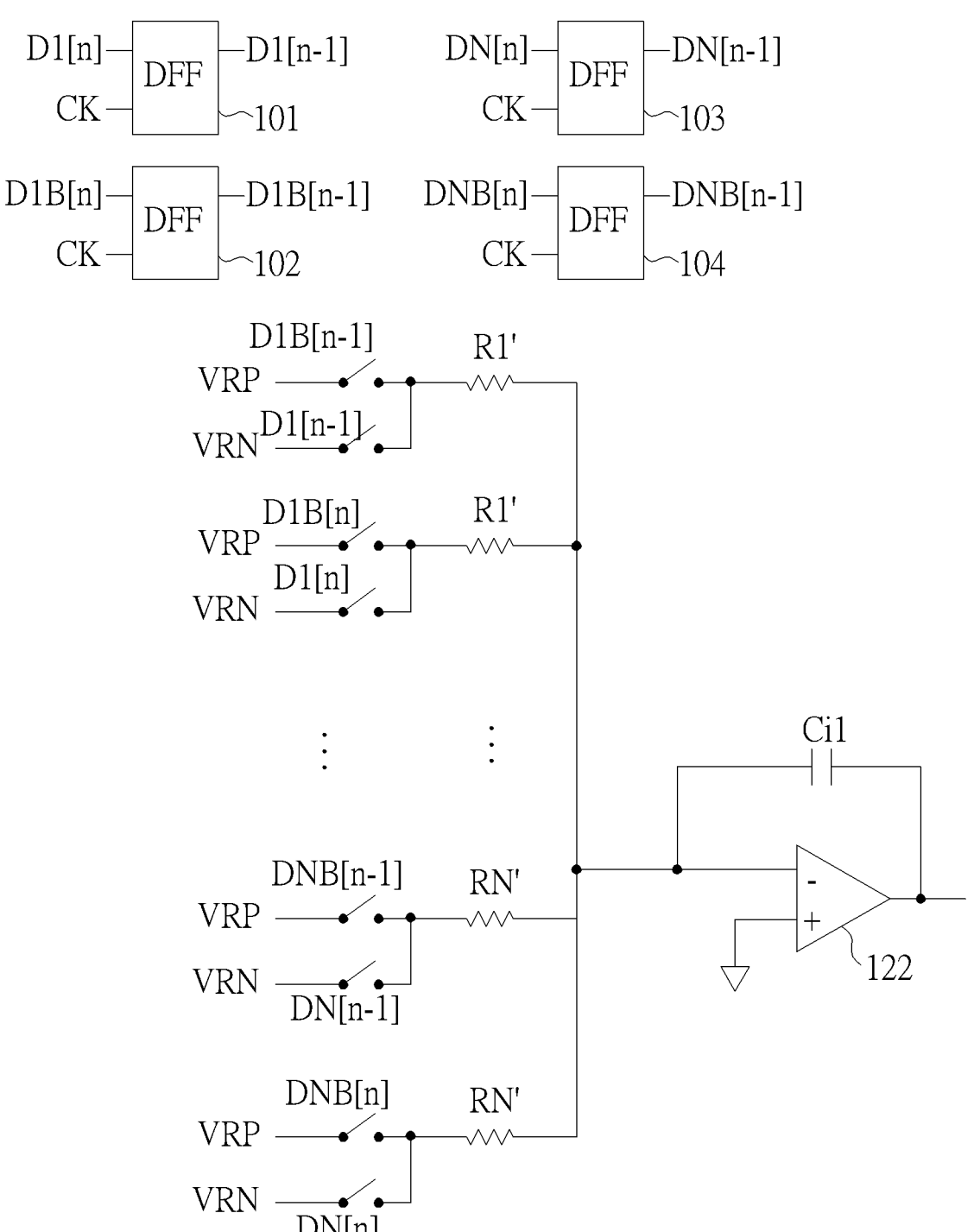
FIG. 2 is a diagram illustrating a special design of a digital-to-analog conversion (DAC) input stage circuit according to an embodiment of the present invention.

FIG. 2 is a diagram illustrating the special design of the DAC input stage circuit 100 according to an embodiment of the present invention, where the digital input signal may comprise a first digital input signal in a first cycle and a second digital input signal in a second cycle after the first cycle. For example, the first digital input signal may be transmitted to an input terminal of a timing control circuit in the first cycle; and in the second cycle, the first digital input signal may be output from an output terminal of the timing control circuit, and the second digital input signal may be transmitted to the input terminal of the timing control circuit at this point. In this embodiment, the timing control circuit may comprise multiple D-type flip-flops (DFFs) such as DFFs 101, 102, 103 and 104, where a signal CK may represent a clock signal. As shown in FIG. 2, in the second cycle, a signal D1[$n$−1] may represent a first bit of the first digital input signal, and a signal D1B[n−1] may represent an inverted bit of the first bit of the first digital input signal. A signal DN[n−1] may represent an $N^{th}$ bit of the first digital input signal, and a signal DNB[n−1] may represent an inverter bit of the $N^{th}$ bit of the first digital input signal. A signal D1[$n$] may represent a first bit of the second digital input signal, and a signal D1B[n] may represent an inverted bit of the first bit of the second digital input signal. A signal DN[n] may represent an $N^{th}$ bit of the second digital input signal, and a signal DNB[n] may represent an inverter bit of the $N^{th}$ bit of the second digital input signal.

In this embodiment, the DAC input stage circuit 100 may comprise a first resistor and a second resistor, where the first resistor and the second resistor may be two identical resistors R1', and the resistance of each resistor R1' may be twice the resistance of the resistor R1. As shown in FIG. 2, both of the two resistors R1' are electrically coupled to the input terminal (e.g. the input terminal labeled "−" on the operational amplifier 122 within the integrator 120 shown in FIG. 1) of the loop filter circuit. In addition, the DAC input stage circuit 100 may further comprise a first switch circuit and a second switch circuit, where the first switch circuit is electrically coupled to the first resistor (e.g. the first resistor R1'), and the second switch circuit is electrically coupled to the second resistor (e.g. the second resistor R1'). In this embodiment, the first switch circuit may be configured to control the first resistor to be electrically coupled to one of the positive reference voltage VRP and the negative reference voltage VRN according to one bit of multiple bits of the first digital input signal. For example, the first switch circuit may comprise switches respectively controlled by the signals D1[$n$−1] and D1B[n−1]. When the signal D1[$n$−1] is "1" and the signal D1B[n−1] is "0", the first resistor R1' may be electrically coupled to the negative reference voltage VRN. When the signal D1[$n$−1] is "0" and the signal D1B[n−1] is "1", the first resistor R1' may be electrically coupled to the positive reference voltage VRP. In addition, the second switch circuit may be configured to control the second resistor to be electrically coupled to one of the positive reference voltage VRP and the negative reference voltage VRN according to one bit of multiple bits of the second digital input signal. For example, the second switch circuit may comprise switches respectively controlled by the signals D1[$n$] and D1B[n]. When the signal D1[$n$] is "1" and the signal D1B[n] is "0", the second resistor R1' may be electrically coupled to the negative reference voltage VRN. When the signal D1[$n$] is "0" and the signal D1B[n] is "1", the second resistor R1' may be electrically coupled to the positive reference voltage VRP. By analogy, the DAC input stage circuit 100 may comprise two identical resistors RN', and the resistance of each resistor RN' may be twice the resistance of the resistor RN, where connections of the first resistor RN' and the second resistor RN' are controlled by the $N^{th}$ bit of the first digital input signal and the $N^{th}$ bit of the second digital input signal, respectively. For example, the connection of the first resistor RN' is controlled by the signals DN[n−1] and DNB[n−1], and the connection of the second resistor RN' is controlled by the signals DN[n] and DNB[n]. For brevity, related details similar to resistors R1' are omitted here. Based on the special design of the DAC input stage circuit 100 shown in FIG. 2, the DAC input stage circuit 100 may have a finite impulse response (FIR) filtering function.

Figure 3:
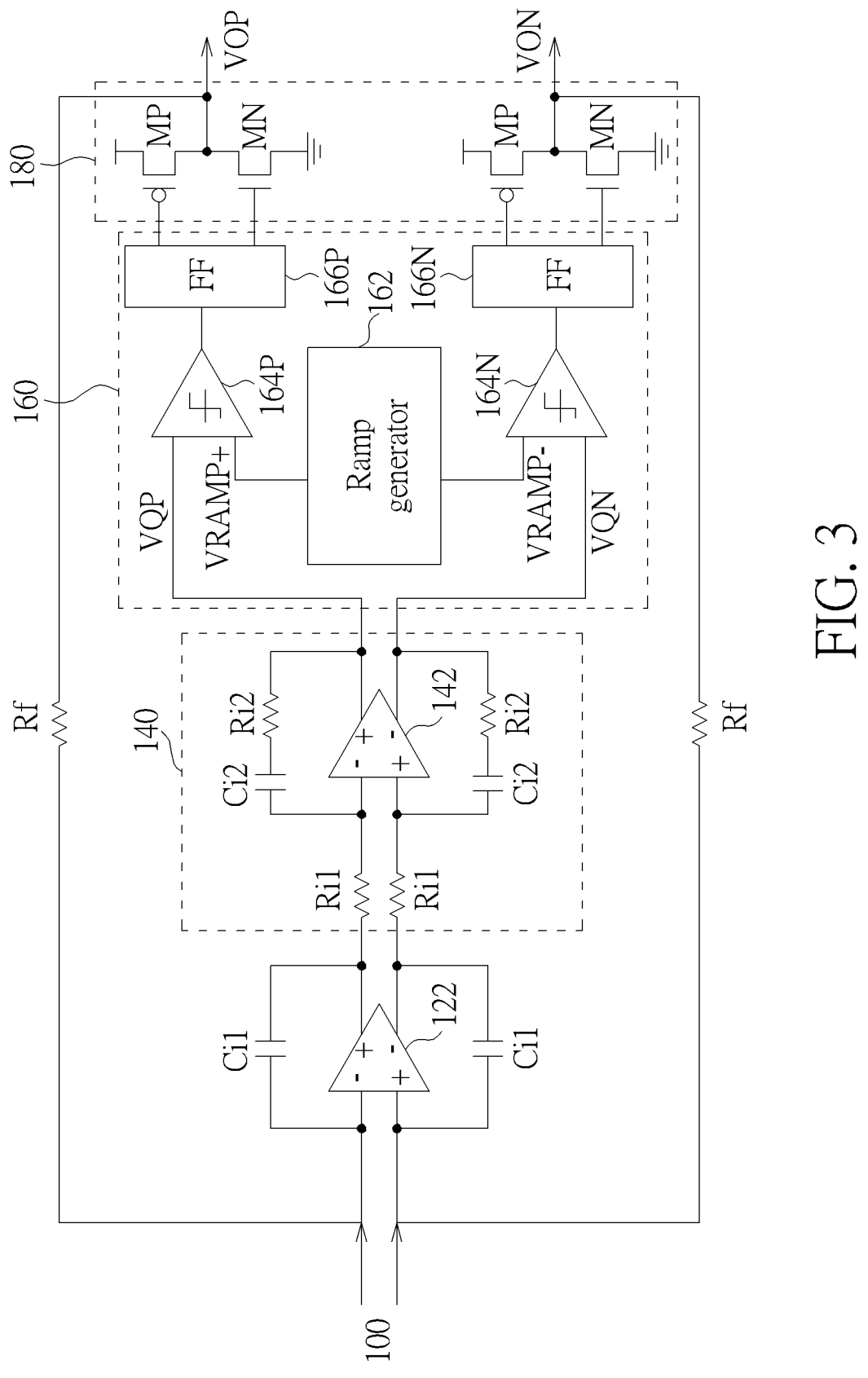
FIG. 3 is a diagram illustrating some details of a hybrid class-D amplifier according to an embodiment of the present invention.

It should be noted that the embodiments of FIG. 1 and FIG. 2 are illustrated based on equivalent single-ended architectures. In practice, the hybrid class-D amplifier 10 is preferably implemented with a differential architecture, as shown in FIG. 3. For brevity, related details of the DAC input stage circuit 100 are not shown in FIG. 3, and those skilled in this art should understand the detailed implementation of the differential architecture of the DAC input stage circuit 100 according to the embodiments of FIG. 1 and FIG. 2. In this embodiment, the integrator 140 may comprise an operational amplifier 142, a resistor Ri1, a resistor Ri2 and a capacitor Ci2. In some embodiments, the loop filter circuit may further comprise other integrators, but the present invention is not limited thereto. In this embodiment, the quantizer circuit 160 may comprise a ramp generator 162, comparators 164P and 164N, and pre-driving circuits 166P and 166N (labeled "FF" in FIG. 3 for brevity). The output stage circuit 180 may comprise a positive output circuit (e.g. an upper-half portion of the output stage circuit 180) and a negative output circuit (e.g. a lower-half portion of the output stage circuit 180), for outputting output signals VOP and VON, respectively, where each of the positive output circuit and the negative output circuit may comprise a pull up circuit such as a P-type transistor MP and a pull down circuit such as an N-type transistor. In this embodiment, the loop filter circuit may output differential filtered signals VQP and VQN from output terminals of the integrator 140. The ramp generator 162 may generate differential ramp signals VRAMP+ and VRAMP− for being used as a reference signal, where the comparator 164P may compare the signal VQP with the ramp signal VRAMP+ to generate a positive comparison result to the pre-driving circuit 166P, and the comparator 164N may compare the signal VQN with the ramp signal VRAMP− to generate a negative comparison result to the pre-driving circuit 166N. Thus, the pre-driving circuit 166P may control the output stage circuit 180 to output the signal VOP (e.g. controlling timing of the output stage circuit 180 outputting the signal VOP) according to the positive comparison result, and the pre-driving circuit 166N may control the output stage circuit 180 to output the signal VON (e.g. controlling timing of the output stage circuit 180 outputting the signal VON) according to the negative comparison result, where different values of the digital output signal may correspond to different pulse widths of the output signal (e.g. the signals VOP and VON), respectively.

In some embodiments, the comparator 164P may compare the signal VQP with a fixed level of a reference signal to generate the positive comparison result to the pre-driving circuit 166P, and the comparator 164N may compare the signal VQN with the fixed level of the reference signal mentioned above to generate the negative comparison result to the pre-driving circuit 166N, where operations of the comparator 164P and the comparator 164N may be synchronized with a clock signal. Under this implementation, different values of the digital input signal may correspond to different pulse densities of the output signal (e.g. the signals VOP and VON), respectively.

Figure 4:
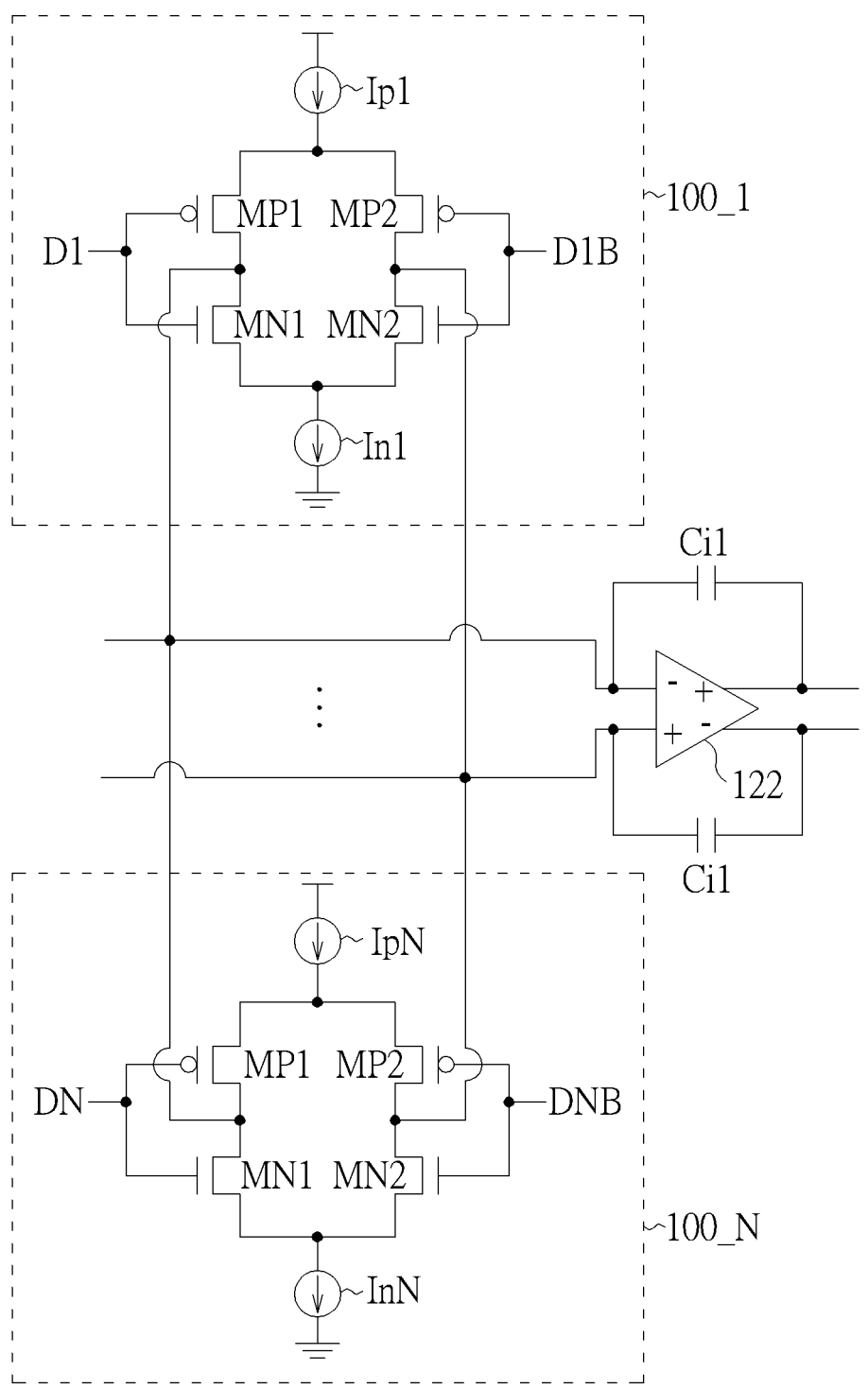
FIG. 4 is a diagram illustrating utilizing current-type DAC units as unit components of a DAC input stage circuit according to an embodiment of the present invention.

It should be noted that embodiments of FIG. 1 and FIG. 2 use resistors to be unit components within the DAC input stage circuit 100, but the present invention is not limited thereto. FIG. 4 is a diagram illustrating utilizing current-type DAC units as unit components within the DAC input stage circuit 100 according to an embodiment of the present invention. As shown in FIG. 4, the DAC input stage circuit 100 may comprise N current-type DAC units 100_1, . . . and 100_N. The current-type DAC unit 100_1 may comprise a first current source such as a current source Ip1, a second current source such as a current source In1, and a switch circuit, where the current source Ip1 is electrically coupled to a first reference voltage such as a power supply voltage, the current source In1 is electrically coupled to a second reference voltage such as a ground voltage, and the switch circuit is electrically coupled to the current source Ip1, the current source In1 and an input terminal of the loop filter circuit. In particular, the switch circuit may comprise multiple transistors such as a P-type transistor MP1, an N-type transistor MN1, a P-type transistor MP2 and an N-type transistor MN2, where the P-type transistor MP1 and the N-type transistor MN1 are controlled by the signal D1, and the P-type transistor MP2 and the N-type transistor MN2 are controlled by the signal D1B. Similar to the embodiment of FIG. 1, the signal D1 may represent the first bit of the digital input signal, the signal D1B may represent the inverted bit of the first bit of the digital input signal, the signal DN may represent the $N^{th}$ bit of the digital input signal, and the signal DNB may represent the inverted bit of the $N^{th}$ bit of the digital input signal. For brevity, related details are omitted here.

In this embodiment, the switch circuit (e.g. the P-type transistor MP1, the N-type transistor MN1, the P-type transistor MP2 and the N-type transistor MN2) may be configured to control the input terminal of the loop filter circuit to be electrically coupled to one of the current source Ip1 and the current source Ip2 according to one bit of the multiple bits of the digital input signal, where either of the terminal labeled "+" and the terminal labeled "−" on the operational amplifier 122 may be an example of the input terminal of the loop filter circuit. For example, when the signal D1 is "1" and the signal D1B is "0", the current source Ip1 may be electrically coupled to the terminal labeled "+" on the operational amplifier 122 via the P-type transistor MP2, and the current source In1 may be electrically coupled to the terminal labeled "−" on the operational amplifier 122 via the N-type transistor MN1. When the signal D1 is "0" and the signal D1B is "1", the current source Ip1 may be electrically coupled to the terminal labeled "−" on the operational amplifier 122 via the P-type transistor MP1, and the current source In1 may be electrically coupled to the terminal labeled "+" on the operational amplifier 122 via the N-type transistor MN2. In addition, an architecture and control of the current-type DAC unit 100_N are similar to the current-type DAC unit 100_1, where the difference is that connection control of corresponding current sources IpN and InN within the current-type DAC unit 100_N are controlled by the signals DN and DNB, and the rest may be deduced by analogy. For brevity, related details are omitted here.

Figure 5:
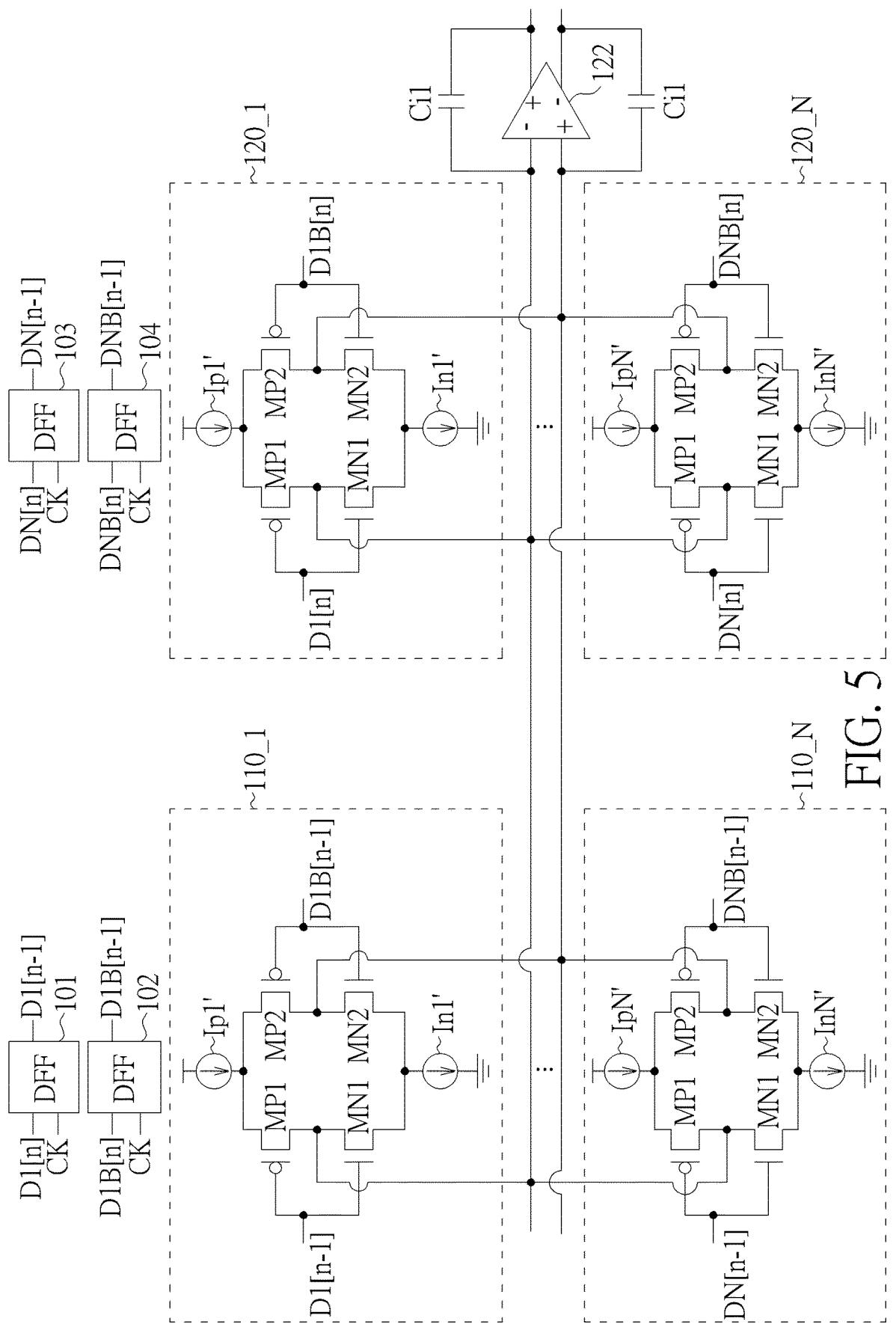
FIG. 5 is a diagram illustrating a special design of a DAC input stage circuit according to another embodiment of the present invention

It should be noted that the concept of the special design shown in FIG. 2 may be applied to the architecture of utilizing the current-type DAC units, as shown in FIG. 5. In the embodiment of FIG. 5, the DAC input stage circuit 100 may comprise N current-type DAC units 110_1, . . . and 110_N controlled by the first digital input signal (e.g. D1[n−1], D1B[n−1], . . . , DN[n−1] and DNB[n−1]) and N current-type DAC units 120_1, . . . and 120_N controlled by the second digital input signal (e.g. D1[n], D1B[n], . . . , DN[n] and DNB[n]). Similar to the embodiment of FIG. 2, the digital input signal may comprise the first digital input signal and the second digital input signal. More particularly, the signal D1[n−1] may represent the first bit of the first digital input signal; the signal D1B[n−1] may represent the inverted bit of the first bit of the first digital input signal; the signal DN[n−1] may represent the $N^{th}$ bit of the first digital input signal; the signal DNB [n−1] may represent the inverted bit of the N$^{th}$ bit of the first digital input signal; the signal D1 [n] may represent the first bit of the second digital input signal; the signal D1B[n] may represent the inverted bit of the first bit of the second digital input signal; the signal DN[n] may represent the N$^{th}$ bit of the second digital input signal; and the signal DNB[n] may represent the inverted bit of the N$^{th}$ bit of the second digital input signal. For brevity, related details are omitted here.

As shown in FIG. 5, the current-type DAC unit 110_1 may comprise a first current source such as a current source Ip1' within the current-type DAC unit 110_1, a second current source such as a current source In1' within the current-type DAC unit 110_1, and a first switch circuit, where the current source Ip1' is electrically coupled to a first reference voltage such as the power supply voltage, the current source In1' is electrically coupled to a second reference voltage such as the ground voltage, and the first switch circuit is electrically coupled to the current source Ip1', the current source In1' and an input terminal of the loop filter circuit. In addition, the current-type DAC unit 120_1 may comprise a third current source such as a current source Ip1' within the current-type DAC unit 120_1, a fourth current source such as a current source In1' within the current-type DAC unit 120_1, and a second switch circuit, where the current source Ip1' is electrically coupled to the first reference voltage such as the power supply voltage, the current source In1' is electrically coupled to the second reference voltage such as the ground voltage, and the second switch circuit is electrically coupled to the current source Ip1', the current source In1' and an input terminal of the loop filter circuit.

In this embodiment, implementation of each of the first switch within the current-type DAC unit 110_1 and the second switch circuit within the current-type DAC unit 120_1 is similar to the switch circuit of the embodiment of FIG. 4, where the first switch circuit may be configured to control the input terminal of the loop filter circuit to be electrically coupled to one of the first current source (e.g. the current source Ip1' within the current-type DAC unit 110_1) and the second current source (e.g. the current source In1' within the current-type DAC unit 110_1) according to one bit of the multiple bit of the first digital input signal, and the second switch circuit may be configured to control the input terminal of the loop filter circuit to be electrically coupled to one of the third current source (e.g. the current source Ip1' within the current-type DAC unit 120_1) and the fourth current source (e.g. the current source In1' within the current-type DAC unit 120_1) according to one bit of the multiple bits of the second digital input signal. In this embodiment, either of the terminal labeled "+" and the terminal labeled "−" on the operational amplifier 122 may be an example of the input terminal of the loop filter circuit. For example, in operations of the current-type DAC unit 110_1, when the signal D1[$n$−1] is "1" and the signal D1B[n−1] is "0", the current source Ip1' may be electrically coupled to the terminal labeled "+" on the operational amplifier 122 via the P-type transistor MP2, and the current source In1' may be electrically coupled to the terminal labeled "−" on the operational amplifier 122 via the N-type transistor MN1. When the signal D1[$n$−1] is "0" and the signal D1B[n−1] is "1", the current source Ip1' may be electrically coupled to the terminal labeled "−" on the operational amplifier 122 via the P-type transistor MP1, and the current source In1' may be electrically coupled to the terminal labeled "+" on the operational amplifier 122 via the N-type transistor MN2. By analogy, when the signal D1 [n] is "1" and the signal D1B[n] is "0", the current source Ip1' may be electrically coupled to the terminal labeled "+" on the operational amplifier 122 via the P-type transistor MP2, and the current source In1' may be electrically coupled to the terminal labeled "−" on the operational amplifier 122 via the N-type transistor MN1. When the signal D1[$n$] is "0" and the signal D1B[n] is "1", the current source Ip1' may be electrically coupled to the terminal labeled "−" on the operational amplifier 122 via the P-type transistor MP1, and the current source In1' may be electrically coupled to the terminal labeled "+" on the operational amplifier 122 via the N-type transistor MN2.

In addition, an architecture and control of the current-type DAC units 110_N and 120_N are similar to the current-type DAC units 110_1 and 120_1, where the difference is that connection control of corresponding current sources IpN' and InN' within the current-type DAC unit 110_N are controlled by the signals DN[n−1] and DNB [n−1], connection control of corresponding current sources IpN' and InN' within the current-type DAC unit 120_N are controlled by the signals DN[n] and DNB [n], and the rest may be deduced by analogy. For brevity, related details are omitted here.

To summarize, the embodiments of the present invention combine a DAC circuit into the input terminal of the loop filter circuit. Based on this architecture, the embodiments of the present invention can omit operational amplifier(s) which are a requirement in typical DAC circuits. In addition, the embodiments of the present invention can also perform programming of gain in the digital domain in advance, and implement the FIR filtering function via the special design of the DAC input stage circuit, allowing the implementation of the PGA to be omitted. Thus, the number of operational amplifiers required in the hybrid class-D amplifier can be reduced as much as possible, thereby reducing overall power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier, comprising:
    a digital-to-analog conversion (DAC) input stage circuit, configured to convert a digital signal into an analog signal;
    a loop filter circuit, electrically coupled to the DAC input stage circuit, configured to generate a filtered signal according to the analog signal and a feedback signal;
    a quantizer circuit, electrically coupled to the loop filter circuit, configured to perform a quantization operation on the filtered signal to generate a quantized signal;
    an output stage circuit, electrically coupled to the quantizer circuit, configured to perform power amplification on the quantized signal to generate an output signal; and
    a feedback circuit, electrically coupled between the output stage circuit and the loop filter circuit, configured to generate the feedback signal according to the output signal;
    wherein the digital signal includes a first digital signal of a first cycle and a second digital signal of a second cycle subsequent to the first cycle, and the DAC input stage circuit comprises:
        a first resistor, electrically coupled to an input terminal of the loop filter circuit;
        a first switch circuit, electrically coupled to the first resistor, configured to control the first resistor to be electrically coupled to one of a first reference voltage and a second reference voltage according to one of multiple bits of the first digital signal;

a second resistor, electrically coupled to the input terminal of the loop filter circuit; and a second switch circuit, electrically coupled to the second resistor, configured to control the second resistor to be electrically coupled to one of the first reference voltage and the second reference voltage according to one of multiple bits of the second digital signal.

2. The amplifier of claim 1, wherein the loop filter circuit comprises one or more integrators, and at least one integrator of the one or more integrators is configured to receive the analog signal and the feedback signal.

3. The amplifier of claim 1, wherein the feedback circuit comprises:

a resistor, electrically coupled between the output stage circuit and the loop filter circuit.

4. The amplifier of claim 1, wherein the quantizer circuit comprises:

a comparator, configured to compare the filtered signal with at least one reference signal to generate a comparison result, wherein the quantized signal is generated according to the comparison result.

5. The amplifier of claim 4, wherein the quantizer circuit further comprises:

a ramp generator, configured to generate the reference signal, wherein the reference signal is a ramp signal.

6. An amplifier, comprising:

a digital-to-analog conversion (DAC) input stage circuit, configured to convert a digital signal into an analog signal;

a loop filter circuit, electrically coupled to the DAC input stage circuit, configured to generate a filtered signal according to the analog signal and a feedback signal;

a quantizer circuit, electrically coupled to the loop filter circuit, configured to perform a quantization operation on the filtered signal to generate a quantized signal;

an output stage circuit, electrically coupled to the quantizer circuit, configured to perform power amplification on the quantized signal to generate an output signal; and a feedback circuit, electrically coupled between the output stage circuit and the loop filter circuit, configured to generate the feedback signal according to the output signal;

wherein the digital signal comprises a first digital signal of a first cycle and a second digital signal of a second cycle after the first cycle, and the DAC input stage circuit comprises:

a first current source, electrically coupled to a first reference voltage;

a second current source, electrically coupled to a second reference voltage;

a first switch circuit, electrically coupled to the first current source, the second current source and an input terminal of the loop filter circuit, configured to control the input terminal of the loop filter circuit to be electrically coupled to one of the first current source and the second current source according to one of multiple bits of the first digital signal;

a third current source, electrically coupled to the first reference voltage;

a fourth current source, electrically coupled to the second reference voltage; and a second switch circuit, electrically coupled to the third current source, the fourth current source and the input terminal of the loop filter circuit, configured to control the input terminal of the loop filter circuit to be electrically coupled to one of the third current source and the fourth current source according to one of multiple bits of the second digital signal.

7. The amplifier of claim 1, wherein different values of the digital signal correspond to different pulse widths or different pulse densities of the output signal, respectively.

* * * * *